United States Patent

Nishi et al.

Patent Number: 5,759,736
Date of Patent: Jun. 2, 1998

[54] PHOTORESIST COMPOSITION

[75] Inventors: Mineo Nishi; Koji Nakano; Tadashi Kusumoto; Yasuhiro Kawase, all of Kitakyushu, Japan

[73] Assignee: Mitsubishi Chemical Corporation, Tokyo, Japan

[21] Appl. No.: 829,959

[22] Filed: Apr. 1, 1997

[30] Foreign Application Priority Data

Apr. 3, 1996 [JP] Japan .................................. 8-081403

[51] Int. Cl.[6] ................................................ G03F 7/023
[52] U.S. Cl. .......................... 430/190; 430/191; 430/192; 430/193
[58] Field of Search ............................ 430/190, 191, 430/192, 193

[56] References Cited

U.S. PATENT DOCUMENTS

| | | | |
|---|---|---|---|
| 5,366,843 | 11/1994 | Jeffries, III et al. | 430/192 |
| 5,376,497 | 12/1994 | Kawata et al. | 430/191 |

FOREIGN PATENT DOCUMENTS

| | | |
|---|---|---|
| 0 703 498 | 3/1996 | European Pat. Off. . |
| 4-012356 | 1/1992 | Japan . |
| 5-323598 | 12/1993 | Japan . |

OTHER PUBLICATIONS

Chemical Abstracts, vol. 120, No. 24, Jun. 13, 1994, and JP 05 323 598, Dec. 7, 1993.

*Primary Examiner*—John S. Chu
*Attorney, Agent, or Firm*—Oblon, Spivak, McClelland, Maier & Neustadt, P.C.

[57] ABSTRACT

A photoresist composition comprising an alkali-soluble resin (A) and a radiation sensitive compound (B), as main components, which further contains a compound (C) of the following formula (I):

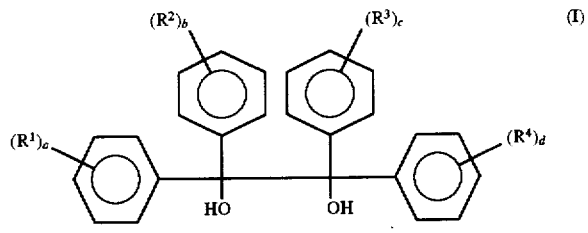

wherein each of $R^1$ to $R^4$ which are independent of one another, is a hydrophobic substituent or a hydrogen atom, provided that all of $R^1$ to $R^4$ are not simultaneously hydrogen atoms, and each of a to d which are independent of one another, is an integer of from 1 to 5, and when any one of $R^1$ to $R^4$ is present in a plurality, the plurality of such any one of $R^1$ to $R^4$ may be the same or different.

9 Claims, No Drawings

PHOTORESIST COMPOSITION

The present invention generally relates to a positive photoresist composition which is sensitive to radiations. Particularly, it relates to a positive photoresist composition comprising an alkali-soluble resin, a radiation sensitive compound and a solvent.

Integrated circuits have been highly integrated year after year. For example, in the case of dynamic random access memory (DRAM), production of DRAM having a memory capacity as large as 16M bits has now started on a commercial basis. Accordingly, the requirements for the photolithography technology essential for the production of such integrated circuits have been stricter year after year. For example, for the production of 1M bits DRAM, a lithography technique of a 1 µm level is required. Whereas, for the production of 4M and 16M bits DRAMs, lithography techniques of 0.8 µm or 0.5 µm level are said to be required, respectively.

Various proposals have been made with respect to photolithography techniques capable of accomplishing such extremely fine processing. For example, from the optical aspect, improvement of the resolving power can be accomplished by high performance of a reduction projection lens, for example, by increasing NA of the lens. However, due to a practical restriction in the production of the lens, there is a limit in securing an adequate exposure area, and there is a difficulty such that the depth of focus decreases in order to improve the resolving power. Further, a method of utilizing a phase shift mask, is also known, whereby the resolving power can be improved. However, due to a substantial difficulty in practical operation for mask production, this method has not yet been developed beyond a laboratory level. Further, a multilayer process such as a three layer resist process has been proposed, but such a process is not practical from the viewpoint of mass production of integrated circuits. Thus, none of such proposals presents a process excellent in mass productivity which is comparable to a conventional single layer process. Accordingly, it has been strongly desired to develop a photoresist composition whereby an adequately high resolving power can be obtained by a single layer process.

Further, for industrial production of integrated circuits, various factors have become important, in addition to the resolving power, along with the progress in dimensional reduction by micro fabrication. For example, a so-called "exposure margin" is regarded as an important factor. This "exposure margin" is tolerance for deflection in actual exposure. In practical production of integrated circuits, deflection in exposure routinely occurs due to e.g. an error in control of the exposure device, an influence of the underlayer of the photoresist film or a stepped portion in the underlayer of the photoresist film, and such occurrence is unavoidable. Such deflection in exposure may cause a resolution failure or development failure which is fatal to the production of normal integrated circuits, and the "exposure margin" is an index for scarceness of such occurrence. Specifically, it can be evaluated by a ratio of E0/Eth, where E0 is the actual sensitivity of the photoresist composition (i.e. the exposure at which the finished dimension after development of the photoresist composition agrees to the designed dimension of the mask or the desired dimension, or at which the ratio of line width to a line space of the finished dimension after development of the photoresist composition exposed via a mask having a pattern with a ratio of line width/line space being 1:1, becomes 1:1), and Eth is the minimum exposure at which the remaining photoresist film becomes 0 (i.e. the minimum exposure at which the photoresist film thereby exposed dissolved completely, so that with an exposure less than this exposure, the photoresist film will remain undeveloped at the exposed portion where the photoresist film should otherwise completely dissolve). Namely, if the ratio of E0/Eth is small, the exposure is likely to be less than E0 even by slight reduction of the quantity of light actually irradiated to the photoresist film from the level of the actual exposure condition, whereby resolution failure or development failure will occur which is fatal to the production of normal integrated circuits. On the other hand, if the ratio of E0/Eth is sufficiently large, it is possible to carry out the production on integrated circuits constantly by such a micro fabrication process.

Further, it is also important to eliminate a phenomenon such that a standing wave will form so that there will be a variation in the light intensity due to multiple deflection of light in the resist film, i.e. there will be a distribution or variation in the decomposition rate of the photo active compound, and there will be accordingly a variation in the dissolving rate of the resist in the developer, whereby the pattern will have a waved shape in its cross section. If a standing wave forms in the cross section of the pattern, it will be difficult to control the dimension in the micro fabrication process, such being undesirable for the production of semiconductors.

Further, it is necessary that for mass production of integrated circuits, the throughput of the micro fabrication process is high, and it is important that the photoresist has high sensitivity. In general, the resolution and the sensitivity are mutually contradictory, and a so-called high resolution resist useful for advanced micro fabrication in recent years, has low sensitivity. Accordingly, it has recently become very important to improve the sensitivity of a photoresist from the viewpoint of mass production of integrated circuits, although it is of course still demanded to improve the resolution.

For the foregoing purposes, various studies have been made with respect to the composition of a photoresist composition, and various proposals have been made also with respect to the additives. In general, when a phenolic hydroxyl group is introduced to an additive to improve the hydrophilicity, the sensitivity will be improved, but the performance tends to be low, since it tends to be readily soluble. On the other hand, if the hydrophobic property is increased, although the sensitivity tends to be low, the performance will not decrease substantially, and, in a rare case, may even improve. For example, various proposals have been made with respect to a compound having a phenolic hydroxyl group. JP-A-4-11260 discloses a positive type photoresist composition comprising a novolak resin, a quinonediazide compound and a trisphenol compound, and JP-A-4-101147 discloses a positive resist composition comprising a quinonediazide compound and an alkali-soluble resin, which further contains a compound having at least one phenolic hydroxyl group and having a molecular weight of from 100 to 900. Due to the solubility of these compounds in an alkali developer, the sensitivity has been improved, but in either case, improvement in the performance is not sufficient. Further, JP-A-5-323598 discloses that a resolving power can be improved by using benzpinacol as an additive, but deterioration of the sensitivity is substantial, and a standing wave is likely to form, such being undesirable from the viewpoint of mass production of integrated circuits. Further, there are additional problems that when such an additive is used, the storage stability tends to be low, or a sublimation product is likely to form at the time of heat treatment which is frequently carried out in the photolithography process, and such sublimation product is likely to cause contamination of the clean room or instruments. Especially in recent years, it has become common to employ a heat treatment at a higher temperature than ever, such as post exposure bake (PEB), since an adverse effect of a standing wave to the performance due to an influence of the multiple reflection in the film can no longer be disregarded for micro fabrication. So it will be required more than ever to eliminate dusting due to the sublimation product in the photosensitive resin composition.

Under these circumstances, it is an object of the present invention to provide a photoresist composition which has a high resolution, a large E0/Eth ratio (large deflection tolerance), high sensitivity and excellent storage stability and which is free from dusting during heat treatment.

In order to solve the above-mentioned problems, the present inventors have conducted various studies and as a result, have found that when a hydrophobic substituent is introduced to a phenyl group of 1,1,2,2-tetraphenylethane diol, reduction of the sensitivity is small as compared with the non-substituted compounds, while high performance can be obtained without a standing wave, by preparing a photoresist composition by incorporating a compound of the following formula (I). The present invention has been accomplished on the basis of this discovery.

Namely, the present invention provides a photoresist composition comprising an alkali-soluble resin (A) and a radiation sensitive compound (B), as main components, which further contains a compound (C) of the following formula (I):

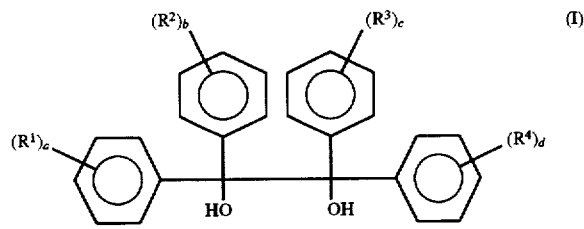

wherein each of $R^1$ to $R^4$ which are independent of one another, is a hydrophobic substituent or a hydrogen atom, provided that all of $R^1$ to $R^4$ are not simultaneously hydrogen atoms, and each of a to d which are independent of one another, is an integer of from 1 to 5, and when any one of $R^1$ to $R^4$ is present in a plurality, the plurality of such any one of $R^1$ to $R^4$ may be the same or different.

Now, the present invention will be described in detail with reference to the preferred embodiments.

It is the feature of the present invention that the photoresist composition contains a compound (C) of the above formula (I). It has been found that in spite of the introduction of a hydrophobic substituent to the phenyl group of 1,1,2,2-tetraphenylethanediol, reduction of the sensitivity is small as compared with the non-substituted compound, and at the same time, the influence of a standing wave can be reduced while securing high performance. In the formula (I), each of $R^1$ to $R^4$ which are independent of one another, is a hydrophobic substituent or a hydrogen atom, provided that all of $R^1$ to $R^4$ are not simultaneously hydrogen atoms. Each of a to d which are independent of one another, is an integer of from 5 of from 1 to 5. Further, when each of $R^1$ to $R^4$ is in a plurality, the plurality of each of $R^1$ to $R^4$ may be the same or different.

The hydrophobic substituent may, for example, be an alkyl group, a cycloalkyl group, an aryl group, an aralkyl group, an alkylcarbonyloxy group, an arylcarbonyloxy group, an alkylsulfonyloxy group, an arylsulfonyloxy group, an alkoxycarbonyl group, an aryloxycarbonyl group, an alkoxysulfonyl group, an aryloxysulfonyl group or a halogen atom. It is preferably a $C_{1-4}$ alkyl group, a $C_{3-10}$ cycloalkyl group, a $C_{6-10}$ aryl group, a $C_{7-14}$ aralkyl group, a $C_{2-5}$ alkylcarbonyl group, a $C_{7-11}$ arylcarbonyloxy group, a $C_{1-4}$ alkylsulfonyloxy group, a $C_{6-10}$ arylsulfonyloxy group, a $C_{2-5}$ alkoxycarbonyl group, a $C_{7-11}$ aryloxycarbonyl group, $C_{1-4}$ alkoxysulfonyl group, a $C_{1-4}$ aryloxysulfonyl group, or a halogen atom. Such a substituent may have at least one substituent such as a hydroxyl group or a halogen atom, provided that no hydroxyl group is directly bonded to the benzene ring by such substitution. Particularly preferred is a $C_{1-4}$ alkyl group, a $C_{1-4}$ alkoxy group, a $C_{2-5}$ alkylcarbonyloxy group, a $C_{7-11}$ arylcarbonyloxy group, a $C_{6-10}$ arylsulfonyloxy group, in which some of hydrogen atoms may be substituted by a halogen atom, or a halogen atom. The $C_{1-4}$ alkyl group may, for example, be a methyl group, an ethyl group, a propyl group or a butyl group. The $C_{1-4}$ alkoxy group may, for example, be a methoxy group, an ethoxy group, a propoxy group or a butoxy group. The $C_{2-5}$ alkylcarbonyloxy group may, for example, be an acetoxy group, a propionyloxy group, a butyronyloxy group or a pentylonyloxy group. The $C_{7-11}$ arylcarbonyloxy group may, for example, be a benzoyloxy group, a p-methylbenzoyloxy group, or a p-methoxybenzoyloxy group. The $C_{6-10}$ arylsulfonyloxy group may, for example, be a benzene sulfonyloxy group, or a p-toluene sulfonyloxy group. The halogen atom may, for example, be a fluorine atom, a chlorine atom, a bromine atom or an iodine atom. Among these hydrophobic substituents, a $C_{1-2}$ alkyl group in which some of hydrogen atoms may be substituted by a halogen atom, an alkoxy group in which some of hydrogen atoms may be substituted by a halogen atom, or an alkylcarbonyloxy group in which some of hydrogen atoms may be substituted by a halogen atom, is preferred. More preferred is a methyl group or a methoxy group. Further, each of a to d which are independent of one another, is preferably an integer of 1 or 2.

With respect to the combination of these substituents, when each of $R^1$ to $R^4$ is in a plurality, the plurality of each of $R^1$ to $R^4$ are preferably the same, more preferably $R^1=R^4$ and $R^2=R^3$, or $R^1=R^3$ and $R^2=R^4$. Preferably, a=d and b=c, or a=c and b=d. More preferably, a=d=1, and b=c=0, or a=c=1 and b=d=0. The compound (C) having such substituents $R^1$ to $R^4$, is preferably the one having a symmetrical molecular structure about the C—C bond connecting the respective carbon atoms having hydroxyl groups. Particularly preferred is the one having a point symmetry about the C—C bond. Specifically, the compound (C) of the formula (I) may, for example, be 1,2-bis(o-methylphenyl)-1,2-diphenyl-1,2-ethanediol, 1,2-bis(m-methylphenyl)-1,2-diphenyl-1,2-ethanediol, 1,2-bis(p-methylphenyl)-1,2-diphenyl-1,2-ethanediol, 1,2-bis(2,4-dimethylphenyl)-1,2-diphenyl-1,2-ethanediol, 1,2-bis(2,5-dimethylphenyl)-1,2-diphenyl-1,2-ethanediol, 1,2-bis(3,4-dimethylphenyl)-1,2-diphenyl-1,2-ethanediol, 1,1,2,2-tetra(p-methylphenyl)-1,2-ethanediol, 1,2-bis(p-methoxyphenyl)-1,2-diphenyl-1,2-ethanediol, 1,2-bis(o-trifluoromethylphenyl)-1,2-diphenyl-1,2-ethanediol, 1,2-bis(m-trifluoromethylphenyl)-1,2-diphenyl-1,2-ethanediol, 1,2-bis(p-trifluoromethylphenyl)-1,2-diphenyl-1,2-ethanediol, 1,2-bis(o-acetoxyphenyl)-1,2-diphenyl-1,2-ethanediol, 1,2-bis(m-acetoxyphenyl)-1,2-diphenyl-1,2-ethanediol, 1,2-bis(p-acetoxyphenyl)-1,2-diphenyl-1,2-ethanediol, or 1,1,2,2-tetra(p-methoxyphenyl)-1,2-diphenyl-1,2-ethanediol. Among them, 1,2-bis(p-methylphenyl)-1,2-diphenyl-1,2-ethanediol, 1,1,2,2-tetra(p-methylphenyl)-1,2-ethanediol, 1,2-bis(p-methoxyphenyl)-1,2-diphenyl-1,2-ethanediol or 1,1,2,2-tetra(p- methoxyphenyl)-1,2-diphenyl-1,2-ethanediol is, for example, particularly preferred.

In the present invention, the compounds (C) of the above formula (I) may be used alone or in combination as a mixture of compounds having different structures.

With respect to the blend ratio of C/(A+B+C)×100 (%), based on the total solid content of the photosensitive resin composition, the upper limit is preferably 3 wt %, particularly preferably 1.5 wt %, and the lower limit is preferably 0.1 wt %, particularly preferably 0.4 wt %, more preferably 1 wt %. If this blend ratio is too small, the effect tends to be inadequate, and if it is too large, the heat resistance tends to be adversely affected.

As the alkali-soluble resin (A) to be used in the present invention, a novolak resin, a polyhydroxystyrene or its derivative, or a styrene-maleic anhydride copolymer may, for example, be specifically mentioned. Preferably, a novolak resin, a polyhydroxystyrene or its derivative is used, and particularly preferably, a novolak resin is used.

The novolak resin can be produced by mixing and heating for polycondensing a monomer component, such as phenol, an alkylphenol such as o-cresol, m-cresol, p-cresol, 3-ethylphenol, 2,5-xylenol or 3,5-xylenol, an alkoxy or aryloxy phenol such as 2-methoxyphenol, 4-methoxyphenol or 4-phenoxyphenol, a naphthol such as α-naphthol, β-naphthol or 3-methyl-α-naphthol, or a polyhydroxybenzene such as 1,3-dihydroxybezene, 1,3-dihydroxy-2-methylbenzene, 1,2,3-trihydroxybenzene, 1,2,3-trihydroxy-5-methylbenzene or 1,3,5-trihydroxybenzene, with an aliphatic aldehyde and its precursor such as formaldehyde, acetaldehyde, paraformaldehyde, paraldehyde or trioxane, an aromatic aldehyde such as benzaldehyde, p-hydroxybenzaldehyde or o-hydroxybenzaldehyde, or a carbonyl compound such as an alkyl ketone such as acetone, using e.g. hydrochloric acid, sulfuric acid, oxalic acid or p-toluene sulfonic acid, as a catalyst. Among them, preferred is a novolak resin produced by mixing and heating for polycondensing one or more of m-cresol, p-cresol and 2,5-xylenol, as the monomer component, with one or more of formaldehyde, acetaldehyde, paraldehyde and p-hydroxybenzaldehyde, using hydrochloric acid, oxalic acid or the like, as the catalyst. Particularly preferred is the one produced by mixing and heating for polycondensing m-cresol, p-cresol and/or 2,5-xylenol, with formaldehyde, with formaldehyde and acetaldehyde, or with formaldehyde and paraldehyde, using hydrochloric acid, oxalic acid or the like as the catalyst, whereby improvement in the resolving power is particularly remarkable. The weight average molecular weight, calculated as polystyrene (hereinafter referred to simply as the molecular weight), of such a novolak resin is preferably at most 30,000, more preferably at most 20,000, preferably at least 2,500, more preferably at least 2,900. If the molecular weight is too low, deterioration of the heat resistance will be remarkable, and if it is too high, deterioration of the sensitivity will be remarkable, such being undesirable for stabilized production of integrated circuits.

The polyhydroxystyrene or its derivative can be produced by polymerizing a hydroxystyrene derivative such as 4-hydroxystyrene, 3-methyl-4-hydroxystyrene or 3-chloro-4-hydroxystyrene.

If necessary, the obtained alkali-soluble resin may further be reduced with e.g. hydrogen to lower light absorption in a short wavelength range. The aromatic compound monomer to be used for producing such an alkali-soluble resin, may have a substituent such as a halogen group, a nitro group or an ester group, so long as such a substituent presents no adverse effect to the present invention.

The radiation sensitive compound (B) to be used in the present invention, may, for example, be a photo active compound containing an orthoquinonediazide group.

The photo active compound containing an orthoquinonediazide group is preferably an orthoquinonediazide type photo active compound such as an ester or an amide of 1,2-benzoquinonediazide-4-sulfonic acid, 1,2-naphthoquinonediazide-4-sulfonic acid or 1,2-naphthoquinonediazide-5-sulfonic acid. Specifically, it may, for example, be an ester of 1,2-benzoquinonediazide-4-sulfonic acid, 1,2-naphthoquinonediazide-4-sulfonic acid or 1,2-naphthoquinonediazide-5-sulfonic acid, with a polyhydroxyalkyl compound such as glycerol or pentaerythritol, or with a polyhydroxyaromatic compound such as a novolak resin, bisphenol A, a gallic acid ester, kelcetine, morin or polyhydroxybenzophenone. Such photo active compounds may be used alone or in combination of two or more of them. Among them, preferred is a 1,2-naphthoquinonediazide-5-sulfonic acid ester of a novolak resin or polyhydroxybenzophenone. The molecular weight of the novolak resin to be used here, is preferably from 400 to 3,000, more preferably from 500 to 2,000. As a particularly preferred radiation sensitive compound, 1,2-naphthoquinonediazide-5-sulfonic acid ester of a novolak resin produced by polycondensing m-cresol as the monomer component, with one or more of formaldehyde, acetaldehyde and 4-hydroxybenzaldehyde, or a 1,2-naphthoquinonediazide-5-sulfonic acid ester of 2,3,4-trihydroxybenzophenone, 2,3,4,4'-tetrahydroxybenzophenone or 2,3,4,2',4'-pentahydroxybenzophenone, may be mentioned. A preferred range of the degree of substitution by esterification of hydroxy groups of such a photo active compound varies depending upon the type of the photo active compound. With respect to the esterification product of a novolak resin, the degree of substitution is preferably at least 20%, more preferably at least 25%, preferably at most 80%, more preferably at most 70%. With respect to the esterification product of a polyhydroxybenzophenone, the degree of substitution is preferably at least 40%, more preferably at least 50%, preferably at most 95%, more preferably at most 90%. If this degree of substitution is too low, the resolving power of the photoresist composition deteriorates, and if it is too high, deterioration of the sensitivity tends to be substantial, such being undesirable. Further, a naphthoquinonediazide sulfonic acid ester of a compound having a phenolic hydroxyl group, as disclosed in e.g. JP-A-2-269351 or JP-A-3-48249, may preferably be used as the photo active compound.

The photoresist composition of the present invention is prepared usually by dissolving it in a solvent. The solvent to be used is not particularly limited so long as it is a solvent commonly used for this purpose. It may, for example, be methyl lactate, ethyl lactate, a glycolic acid ester derivative such as ethyl glycolate, ethylcellusolve acetate, methylcellusolve acetate, a glycol ether ester derivative such as propylene glycol monomethylether acetate, a ketone ester such as methyl pyruvate or ethylpyruvate, an alkoxy carboxylic acid ester such as methyl 3-methoxy-propionate, ethyl 3-ethoxy-propionate or methyl 3-ethoxy-propionate, a ketone derivative such as acetyl acetone, cyclopentanone, cyclohexanone or 2-heptanone, a ketone ether derivative such as diacetone alcohol methyl ether, a ketone alcohol derivative such as acetol or diacetone alcohol, an amide derivative such as dimethylacetamide or dimethylformamide, or an ether derivative such as anisole or diethylene glycol dimethyl ether. Further, a solvent mixture thereof may be employed. If necessary, a solvent mixture having xylene, butyl acetate or γ-butyrolactone incorporated, may be employed. Among them, the mixture solvent containing methyl 3-methoxypropionate, ethyl lactate, or ethyl lactate as the main component, is preferably employed in view of the storage stability, uniformity of the film, the safety or the handling efficiency. Particularly preferably, methyl 3-methoxypropionate, methyl 3-ethoxypropionate, 2-heptanone, or a solvent mixture of ethyl lactate with propylene glycol monomethylether acetate or butyl acetate, is employed.

In the photoresist composition of the present invention, the proportion of the radiation sensitive compound to the alkali-soluble resin is usually from 0.1 to 5.0 times by weight, preferably 0.1 to 2.0 times. Further, the concentration of the alkali-soluble resin in the photoresist composition of the present invention containing a solvent is usually from 1 to 40 wt %, and the concentration of the radiation-sensitive compound is usually from 0.1 to 15 wt %.

Further, to the photoresist composition of the present invention, a surfactant may be added to improve the coating property. It is particularly preferred to incorporate a fluorine type surfactant. Such a surfactant may be added preferably in an amount of at most 1,000 ppm, more preferably at most 200 ppm, based on the photoresist liquid. Further, a light-absorbing material may be added to reduce the influence of a scattered light from the substrate, or a sensitizer or the like may further be added to improve the sensitivity.

To prepare the photoresist composition from the various constituting components as described above, the compound (C) may first be dissolved, and then other components may be mixed. Otherwise, components other than compound (C) may be mixed and dissolved first, and then compound (C) may be mixed thereto. In the production of IC, the content of impurities such as trace amounts of metals in a material to be used, is desired to be as small as possible. Also with respect to the photoresist composition, in order to improve the purity, the respective constituting components may respectively be purified by e.g. an ion exchange method and then mixed to produce the photoresist composition, or the respective constituting components may be mixed to form a photoresist composition, which is then purified by e.g. an ion exchange method before use. When it is actually used for the production of integrated circuits, it is common to subject it to filtration by a filter with submicron pores before use.

Now, the present invention will be described in further detail with reference to Examples. However, it should be understood that the present invention is by no means restricted to such specific Examples. In the following Examples, the molecular weight represents a weight average molecular weight (the analytical value calculated as polystyrene, by a gel permeation chromatography method).

PREPARATION EXAMPLE 1

Preparation of 1,2-bis(p-methylphenyl)-1,2-diphenyl-1,1,2-ethanediol 0.04 g of acetic acid was added to 35.98 g of isopropyl alcohol, and 4.02 g of 4-methylbenzophenone was dissolved therein. To this solution, ultraviolet rays were irradiated by a high pressure mercury lamp (UVL-100HA, manufactured by Riko Kagaku Sangyo K.K.) to carry out the reaction for 4 hours. After the reaction, the solvent was distilled off to obtain 3.99 g of 1,2-bis(p-methylphenyl)-1,2-diphenyl-1,2-ethanediol (compound (C1)).

PREPARATION EXAMPLE 2

Preparation of 1,2-bis(p-methoxyphenyl)-1,2-diphenyl-1,2-ethanediol 0.04 g of acetic acid was added to 35.98 g of isopropyl alcohol, and 4.02 g of 4-methoxybenzophenone was dissolved therein. To this solution, ultraviolet rays were irradiated by a high pressure mercury lamp (UVL-100HA, manufactured by Riko Kagaku Sangyo K.K.) to carry out the reaction for 4 hours. After the reaction, the solvent was distilled off to obtain 4.01 g of 1,2-bis(p-methoxyphenyl)-1,2-diphenyl-1,2-ethanediol (compound (C2)).

PREPARATION EXAMPLE 3

Preparation of 1,2-bis(p-acetoxyphenyl)-1,2-diphenyl-1,2-ethanediol 0.04 g of acetic acid was added to 35.98 g of isopropyl alcohol, and 4.02 g of 4-acetoxybenzophenone was dissolved therein. To this solution, ultraviolet rays were irradiated by a high pressure mercury lamp (UVL-100HA, manufactured by Riko Kagaku Sangyo K.K.) to carry out the reaction for 6 hours. After the reaction, the solvent was distilled off to obtain 4.00 g of 1,2-bis(p-acetoxyphenyl)-1,2-diphenyl-1,2-ethanediol (compound (C5)).

Example 1

4.642 g of a novolak resin (molecular weight: 3,000) (alkali-soluble resin (A)) produced from m-cresol, p-cresol and 2,5-xylenol (molar ratio of 5/4/1), and formaldehyde and acetaldehyde (molar ratio of 8/2), 1.189 g of an esterification product (esterification degree: 40%) (radiation sensitive compound (B1)) of 1,2-naphthoquinonediazide-5-sulfonic acid with a condensate (molecular weight: 1,000) of m-cresol with acetaldehyde, 3.749 g of an esterification product (esterification degree: 25%) (radiation sensitive compound (B2)) of 1,2-naphthoquinonediazide-5-sulfonic acid with a condensate (molecular weight: 1,100) of m-cresol with acetaldehyde, and 0.097 g of compound (C1) obtained in Preparation Example 1, were dissolved in a solvent mixture comprising 21 g of ethyl lactate and 9 g of propylene glycol monomethyl ether acetate. The mixture was filtered through a teflon filter with pores of 0.2 μm to obtain photoresist composition 1. The results are shown in Table 2.

Example 2

Photoresist composition 2 was prepared in the same manner as in Example 1 except that in Example 1, instead of compound (C1), compound (C2) obtained in Preparation Example 2 was used to prepare the composition as shown in Table 1.

Example 3

In Example 1, instead of compound (C1), 1,1,2,2-tetra(4-methylphenyl)-1,2-ethanediol (manufactured by Tokyo Kasei K.K.) (C3) was used to obtain the composition as shown in Table 1. Here, photoresist composition 5 was prepared in the same manner as in Example 1 except that a novolak resin (molecular weight: 3,200) prepared in the same manner as in Example 1 was used. The results are shown in Table 3.

Example 4

Photoresist composition 6 was prepared in the same manner as in Example 3 except that in Example 3, instead of compound (C3), 1,1,2,2-tetra(4-methoxyphenyl)-1,2-ethanediol (manufactured by Tokyo Kasei K.K.) (C4) was used to obtain the composition as shown in Table 1. The results are shown in Table 3.

Example 5

Photoresist composition 7 was prepared in the same manner as in Example 3 except that in Example 3, instead of compound (C3), compound (C5) obtained in Preparation Example 3 was used to obtain the composition as shown in Table 1. The results are shown in Table 3.

Example 6

Photoresist composition 8 was prepared in the same manner as in Example 3 except that in Example 3, instead of compound (C3), 1,1,2,2-tetra(3-trifluoromethylphenyl)-1,2-ethanediol (manufactured by Aldrich Chemical Company) (C6) was used to obtain the composition as shown in Table 1. The results are shown in Table 3.

Comparative Example 1

Photoresist composition 3 was prepared in the same manner as in Example 1 except that in Example 1, compound (C1) was not used to obtain the composition as shown in Table 1.

Comparative Example 2

Photoresist composition 4 was prepared in the same manner as in Example 1 except that in Example 1, instead of compound (C1), 1,1,2,2-tetraphenyl-1,2-ethanediol was used to obtain the composition as shown in Table 1.

Comparative Example 3

Photoresist composition 9 was prepared in the same manner as in Example 3 except that in Example 3, instead of compound (C3), 1,1,2,2-tetraphenyl-1,2-ethanediol was used to prepare the composition as shown in Table 1.
Evaluation method Photoresist compositions 1 to 9 were respectively coated on silicon wafers by spin coating and then heated on a hot plate of 90° C. for 60 minutes to remove the solvents to form photoresist coating films having a film thickness of 1.07 μm. They were exposed by an i-line stepper (NA. =0.50), manufactured by Nikkon K.K., then heated on a hot plate of 110° C. for 60 seconds, then immersed in a 2.38% tetramethylammonium hydroxide aqueous solution for 60 seconds for development. The cross sectional shapes of the formed patterns were inspected by an electron microscope, and the respective Eth, E0, E0/Eth and resolution (minimum pattern size of line width/line space pattern resolved with E0) were evaluated. At that time, the presence or absence of a standing wave in the cross section of the patterns was also evaluated (symbol ○ indicates presence, and symbol x indicates absence). Further, storage stability was evaluated (each photoresist composition was maintained at room temperature, and upon expiration of 6 months, the one having no insoluble matters formed in the photoresist liquid was evaluated to be good). The results are shown in Table 2 and Table 3.

The coating films formed on silicon substrates from photoresist compositions of Examples 1 to 6 were subjected to heat treatment by a hot plate to evaluate sublimation properties of the photoresist compositions by collecting sublimed substances. However, no sublimed substances were detected with respect to any one of the photoresist compositions. In the same manner, the sublimation properties of the photoresist compositions having 2,3,4-trihydroxybenzophonone (3HBP) incorporated as an additive, were evaluated, whereby an amount corresponding to 10% of the incorporated 3HBP was detected as a sublimed substance.

TABLE 1

| | Amounts (g) | | | | | |
|---|---|---|---|---|---|---|
| | Alkali-soluble resin (A) | Radiation sensitive compound (B1) | Radiation sensitive compound (B2) | Compound (C) | Solvent | C/(A1 + B1 + B2 + C) × 100 (%) |
| Examples 1 to 6 | 4.642 | 1.189 | 3.794 | 0.097 | 30.3 | 1.0 |
| Comparative Example 1 | 4.793 | 1.189 | 3.794 | — | 30.3 | — |
| Comparative Examples 2 and 3 | 4.642 | 1.189 | 3.794 | 0.097 | 30.3 | 1.0 |

TABLE 2

| | | Eth (msec) | E0 (msec) | E0/Eth | Resolution | Storage stability | Standing wave |
|---|---|---|---|---|---|---|---|
| Example 1 | Photoresist composition 1 | 220 | 496 | 2.25 | 0.30 | Good | ○ |
| Example 2 | Photoresist composition 2 | 223 | 500 | 2.24 | 0.30 | Good | ○ |
| Comparative Example 1 | Photoresist composition 3 | 166 | 287 | 1.73 | 0.36 | Good | ○ |
| Comparative Example 2 | Photoresist composition 4 | 244 | 531 | 2.18 | 0.30 | Good | X |

TABLE 3

|  |  | Eth (msec) | E0 (msec) | E0/Eth | Resolution | Storage stability | Standing wave |
|---|---|---|---|---|---|---|---|
| Example 3 | Photoresist composition 5 | 246 | 631 | 2.57 | 0.32 | Good | ○ |
| Example 4 | Photoresist composition 6 | 245 | 599 | 2.44 | 0.32 | Good | ○ |
| Example 5 | Photoresist composition 7 | 240 | 535 | 2.23 | 0.30 | Good | ○ |
| Example 6 | Photoresist composition 8 | 250 | 577 | 2.31 | 0.32 | Good | ○ |
| Comparative Example 3 | Photoresist composition 9 | 285 | 670 | 2.35 | 0.30 | Good | X |

The ratio of E0/Eth where E0 is the exposure required for finish with a predetermined dimension and Eth is the minimum exposure at which the remaining photoresist film becomes 0, is regarded as an index for exposure margin. For the production of semiconductors, the larger the ratio, the better.

In Comparative Example 1, the ratio of E0/Eth is small as compared with Examples 1 and 2, and the resolving power was also poor. In Comparative Example 2, the actual exposure E0 required is large as compared with Examples 1 and 2, and in Comparative Example 3, the actual exposure E0 required is large as compared with Examples 3 to 6, and a standing wave was observed on the side wall of the pattern.

As compared with Comparative Example 1, the photoresist composition of the present invention has a high resolving power and a large E0/Eth ratio indicating good developability, and as compared with Comparative Examples 2 and 3, it has a high sensitivity and capable of reducing an influence of a standing wave and further has a good storage stability, and it is free from dusting at the time of heat treatment. Therefore, it is useful for production of integrated circuits, particularly as a photoresist for micro fabrication.

Further, with the photoresist composition of the present invention, a higher resolving power can be achieved as compared with a conventional product even by using the same single layer process. Besides, it has good developability, high sensitivity and excellent storage stability and is free from dusting by sublimation during the heat treatment. Thus, it is suitable as a photoresist for micro fabrication. Especially with respect to the resolving power and the sensitivity, as shown by Examples, the sensitivity was improved by about 10% as compared with a case where benzpinacol was used, while maintaining a resolving power of 0.30 μm beyond the wavelength of the light for exposure. This makes it possible to constantly produce 16 MDRAM which is presently being mass produced and presents a possibility to produce 64 MDRAM while maintaining high productivity, which used to be believed impossible by photolithography. Thus, a lithography technique has been established which is useful for micro fabrication which makes mass production of integrated circuits possible. Thus, the significance of the present invention for the production of IC is substantial.

What is claimed is:

1. A photoresist composition comprising an alkali-soluble resin (A) and a radiation sensitive compound (B), as main components, which further contains a compound (C) of the following formula (I):

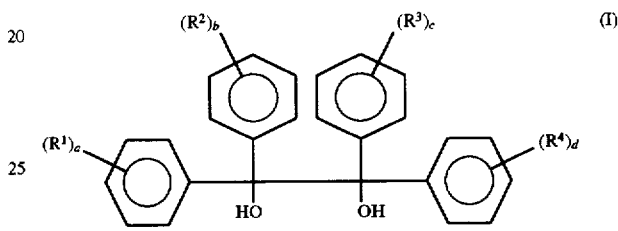

wherein each of $R^1$ to $R^4$ which are independent of one another, is a hydrophobic substituent or a hydrogen atom, provided that all of $R^1$ to $R^4$ are not simultaneously hydrogen atoms, and each of a to d which are independent of one another, is an integer of from 1 to 5, and when any one of $R^1$ to $R^4$ is present in a plurality, the plurality of such any one of $R^1$ to $R^4$ may be the same or different.

2. The photoresist composition according to claim 1, which contains the compound (C) in an amount of from 0.1 to 3 wt %, based on the solid content of the photoresist composition.

3. The photoresist composition according to claim 1, which contains the compound (C) in an amount of from 0.4 to 1.5 wt %, based on the solid content of the photoresist composition.

4. The photoresist composition according to claim 1, wherein in the formula (I), at least one of $R^1$ to $R^4$ is a $C_{1-4}$ alkyl group which may be substituted by a halogen atom, an alkoxy group which may be substituted by a halogen atom, an alkyl ester group which may be substituted by a halogen atom, an aromatic ester group which may be substituted by a halogen atom, or a halogen atom.

5. The photoresist composition according to claim 1, wherein in the formula (I), at least one of $R^1$ to $R^4$ is a methyl group.

6. The photoresist composition according to claim 1, wherein the compound (C) has a symmetrical molecular structure about the C—C bond connecting the respective carbon atoms having hydroxyl groups.

7. The photoresist composition according to claim 1, wherein the alkali-soluble resin (A) is a novolak resin, and the radiation sensitive compound (B) is a photo active compound containing an orthoquinonediazide group.

8. The photoresist composition according to claim 7, wherein the novolak resin is a resin obtained by polycondensation of at least one member selected from the group consisting of m-cresol, p-cresol and 2,5-xylenol, with at least one aldehyde selected from the group consisting of formaldehyde, acetaldehyde, paraldehyde and p-hydroxybenzaldehyde.

9. The photoresist composition according to claim 7, wherein the photo active compound containing an ortho-quinonediazide group is a 1,2-naphthoquinonediazide-5-sulfonic acid ester of at least one compound selected from the group consisting of a novolak resin and a polyhydroxybenzophenone.

* * * * *